United States Patent
Kim et al.

(10) Patent No.: US 6,951,814 B2
(45) Date of Patent: Oct. 4, 2005

(54) METHODS FOR FORMING A METAL WIRING LAYER ON AN INTEGRATED CIRCUIT DEVICE AT REDUCED TEMPERATURES

(75) Inventors: Byung-hee Kim, Seoul (KR); Gil-heyun Choi, Yongin (KR); Ju-young Yun, Seoul (KR); Jung-hun Seo, Gangreung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/649,154

(22) Filed: Aug. 27, 2003

(65) Prior Publication Data

US 2004/0096571 A1 May 20, 2004

(30) Foreign Application Priority Data

Nov. 16, 2002 (KR) ................................ 10-2002-0071387

(51) Int. Cl.[7] .............................................. H01L 21/44
(52) U.S. Cl. ....................... 438/658; 438/680; 438/688; 204/192.17
(58) Field of Search ...................... 204/192.17; 438/675, 438/688, 631–634, 648, 658, 680–681, 685

(56) References Cited

U.S. PATENT DOCUMENTS

| | | | | |
|---|---|---|---|---|
| 5,523,624 A | * | 6/1996 | Chen et al. ................... | 257/751 |
| 5,877,086 A | * | 3/1999 | Aruga ......................... | 438/653 |
| 5,883,433 A | * | 3/1999 | Oda ............................ | 257/750 |
| 6,075,293 A | * | 6/2000 | Li et al. ...................... | 257/763 |
| 6,355,558 B1 | * | 3/2002 | Dixit et al. .................. | 438/642 |
| 6,448,173 B1 | * | 9/2002 | Clevenger et al. ........... | 438/627 |
| 6,586,340 B2 | * | 7/2003 | Lee et al. .................... | 438/715 |
| 2002/0098682 A1 | * | 7/2002 | Kim et al. ................... | 438/627 |

FOREIGN PATENT DOCUMENTS

KR   1020020009013   2/2002

OTHER PUBLICATIONS

Case et al., A Comparison of Three Low Dielectric Constant Organic Polymers, 1997, Material Research Society, vol. 443, pp 177–182.*

Fiordalice et al., A Low Temperature CVD Al Plug and Interconnect Process for 0–25 Micron Metallization Technologies, 1996, IEEE, Symposium on VLSI Technology Digest of Technical papers, pp 42–43.*

Lee et al. Integration of Chemical Vapor Deposition Aluminum and Physical Vapor Deposition Aluminum for Aluminum Plug Process of Sub–Quater Micron Devices, 2000, The Japan Society of Applied Physics, pp 1694–1700.*

Notice to Submit Response for corresponding Korean Application No. 10–2002–0071387 dated Jul. 15, 2004 (English Translation).

* cited by examiner

*Primary Examiner*—George Fourson
*Assistant Examiner*—Thanh V. Pham
(74) *Attorney, Agent, or Firm*—Myers Bigel Sibley & Sajovec (57) ABSTRACT

Methods of forming a metal wiring layer on an integrated circuit include forming an insulating pattern including a recess region on an integrated circuit substrate. A metal layer is formed in the recess region and on a top surface of the insulting pattern. The metal layer is removed from the top surface of the insulating pattern adjacent the recess region and from an upper portion of the recess region. An aluminum film is formed on the metal layer at a process temperature less than a reflow temperature of the metal layer to substantially fill the upper portion of the recess region after removing the metal layer. A metal film is formed on the aluminum film at a process temperature less than the reflow temperature of the etched metal layer.

39 Claims, 6 Drawing Sheets

METHODS FOR FORMING A METAL WIRING LAYER ON AN INTEGRATED CIRCUIT DEVICE AT REDUCED TEMPERATURES

RELATED APPLICATION

This application claims priority to Korean Patent Application 2002-71387, filed on Nov. 16, 2002, the contents of which are herein incorporated by reference in their entirety.

BACKGROUND OF THE INVENTION

The present invention relates to methods for forming a metal layer on an integrated circuit, and more particularly, to methods of forming a metal wiring layer on a highly-integrated integrated circuit device.

Integrated (semiconductor) circuits are widely used in consumer and commercial applications. As the integration density of integrated circuit devices continues to increase, it is increasingly difficult to form high-density interconnections, also referred to as wiring layers, on integrated circuits. These wiring layers generally have a multi-layered structure. As the metal wiring layer is generally used to transmit electrical signals, it is desirable to provide a metal wiring layer having a low electric resistance and a high reliability.

As integrated circuit devices become more highly integrated, the feature sizes decrease and a width and thickness of the metal wiring layer and the size of included contact holes may decrease. As feature sizes of the integrated circuit device decrease, such as the width of a circuit line, it typically becomes more difficult to form the metal wiring by etching a metal film. Furthermore, it may be desirable to minimize the thermal budget (i.e., amount of thermal processing) imposed by backend process(es) used in manufacturing the highly-integrated device. If the thermal budget in the backend process(es) increases, the electrical characteristics of the resulting integrated circuit device, such as capacitor characteristics, may be degraded.

Aluminum (Al) is widely used as a material for the metal wiring layer of an integrated circuit device. In forming an Al metal wiring layer, it is generally important to fully fill up included contact hole(s) connecting conductive layer(s) at a lower layer of the integrated circuit device with the Al wiring layer located on a higher layer than the conductive layer(s) so as to electrically connect the conductive layers.

Various approaches are known to improve device electrical characteristics and to fully fill such contact holes between layers (as used herein, the term "contact hole" includes via holes) and/or trenches with aluminum. However, as circuit density increases, for example, to require a metal wiring layer having a circuit line width less than 0.25 micrometers ($\mu$m), the aspect ratio of the contact hole or trench increases. As a result, the difficulty of fully filling the contact hole and or/trench with Al by using a physical vapor deposition (PVD) type process, such as a sputtering method, may increase.

One known approach to this problem is to first form a barrier metal film and then to form the aluminum film on the barrier metal film using physical vapor deposition. After forming the aluminum film, a reflow process is used to finish forming of the aluminum wiring layer in the recess region, such as the contact hole. The reflow process is a thermal process in which sufficient heat is applied to the Al film to thermally flow the Al film to improve fill of the recess region. However, to flow the aluminum, the reflow process is generally performed at a temperature of about 500° C. As a result, the reflow process adds a thermal budget to the process for manufacturing the metal wiring layer.

SUMMARY OF THE INVENTION

In some embodiments of the present invention, methods of forming a metal wiring layer on an integrated circuit include forming an insulating pattern including a recess region on an integrated circuit substrate. A metal layer is formed in the recess region and on a top surface of the insulting pattern. The metal layer is removed from the top surface of the insulating pattern adjacent the recess region and from an upper portion of the recess region. An aluminum film is formed on the metal layer at a process temperature less than a reflow temperature of the metal layer to substantially fill the upper portion of the recess region after removing the metal layer. A metal film is formed on the aluminum film at a process temperature less than the reflow temperature of the etched metal layer.

In other embodiments of the present invention, the metal layer is removed by etching and/or chemical mechanical polishing (CMP) the metal layer. A barrier metal film may be formed on inner walls of the recess and on the top surface of the insulating pattern adjacent the recess region before forming a metal layer. The barrier film may be a titanium nitride (TiN) and/or a Ti/TiN stack structure barrier film.

In further embodiments of the present invention, the aluminum film is formed at a temperature of between about 90° C. and about 400° C. The aluminum film may be formed by chemical vapor deposition (CVD). In a particular embodiment, the aluminum film is formed by metal organic chemical vapor deposition using an aluminum source, where the aluminum source is an organometallic compound selected from the group consisting of dimethylethylamino alane, methylpyrrolidine alane, dimethyl aluminum hydride, trimethyl aluminum, trimethylamine alane and triisobutyl aluminum.

In other embodiments of the present invention, the metal film is formed at a temperature of between about −20° C. and about 400° C. The metal film may be formed by physical vapor deposition (PVD). The metal film may be an aluminum film and/or an aluminum alloy film.

In further embodiments of the present invention, the metal layer is a tungsten layer. The tungsten layer may be formed at a temperature of between about 200° C. and about 400° C. The tungsten layer may by formed by chemical vapor deposition (CVD) and/or atomic layer deposition (ALD). Subsequent back end processing steps may also be performed at process temperatures less than the reflow temperature of the metal layer.

In other embodiments of the present invention, a conductive region is formed on the integrated circuit substrate before forming the insulating pattern. In such embodiments, the recess region is a contact hole extending to the conductive region and forming a metal layer includes forming a metal plug in the contact hole. In other embodiments, the recess region is a trench.

In further embodiments of the present invention, methods of forming a metal wiring layer of a semiconductor device include forming an insulating film pattern including a recess region on a semiconductor substrate. A barrier metal film is formed on inner walls of the recess region and on a top surface of the insulating film pattern. A metal plug is formed on the barrier metal film to fill up the recess region. An aluminum film is formed on the metal plug and the insulating film pattern at a temperature of about 90° C. to about 400° C. and a metal film is formed on the aluminum film at a temperature of about −20° C. to about 400° C. The aluminum film may be formed by chemical vapor deposition and the metal film may be formed by physical vapor deposition.

The recess region may be a contact hole that exposes a conductive region of the semiconductor substrate. The recess region may be a trench that is formed to a depth that is shallower than a thickness of the insulating film pattern. The barrier metal film may be formed of TiN. The metal plug may be formed of tungsten.

Forming the metal plug may include forming a tungsten film inside the recess region and on the insulating film pattern and planarizing the tungsten film to form the metal plug with tungsten inside the recess region. The tungsten film may be formed by using chemical vapor deposition and/or atomic layer deposition. The tungsten film may be formed at a temperature of about 200° C. to about 400° C. The tungsten film may be planarized by using chemical mechanical polishing and/or etchback.

The aluminum film may be formed using metal organic chemical vapor deposition where an organometallic compound, which is selected from the group consisting of dimethylethylamino alane, methylpyrrolidine alane, dimethyl aluminum hydride, trimethyl aluminum, trimethylamine alane or triisobutyl aluminum, is used as an aluminum source. The metal film may be formed of an aluminum film and/or an aluminum alloy film.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "on" or "connected to" or "coupled to" another element, it can be directly on, connected to or coupled to the other element or intervening layers or elements may also be present. In contrast, when an element is referred to as being "directly on" or "directly connected to" or "directly coupled to" another element, there are no intervening layers or elements present. The relative thickness of layers in the illustrations may be exaggerated for purposes of describing the present invention.

Figure 1:
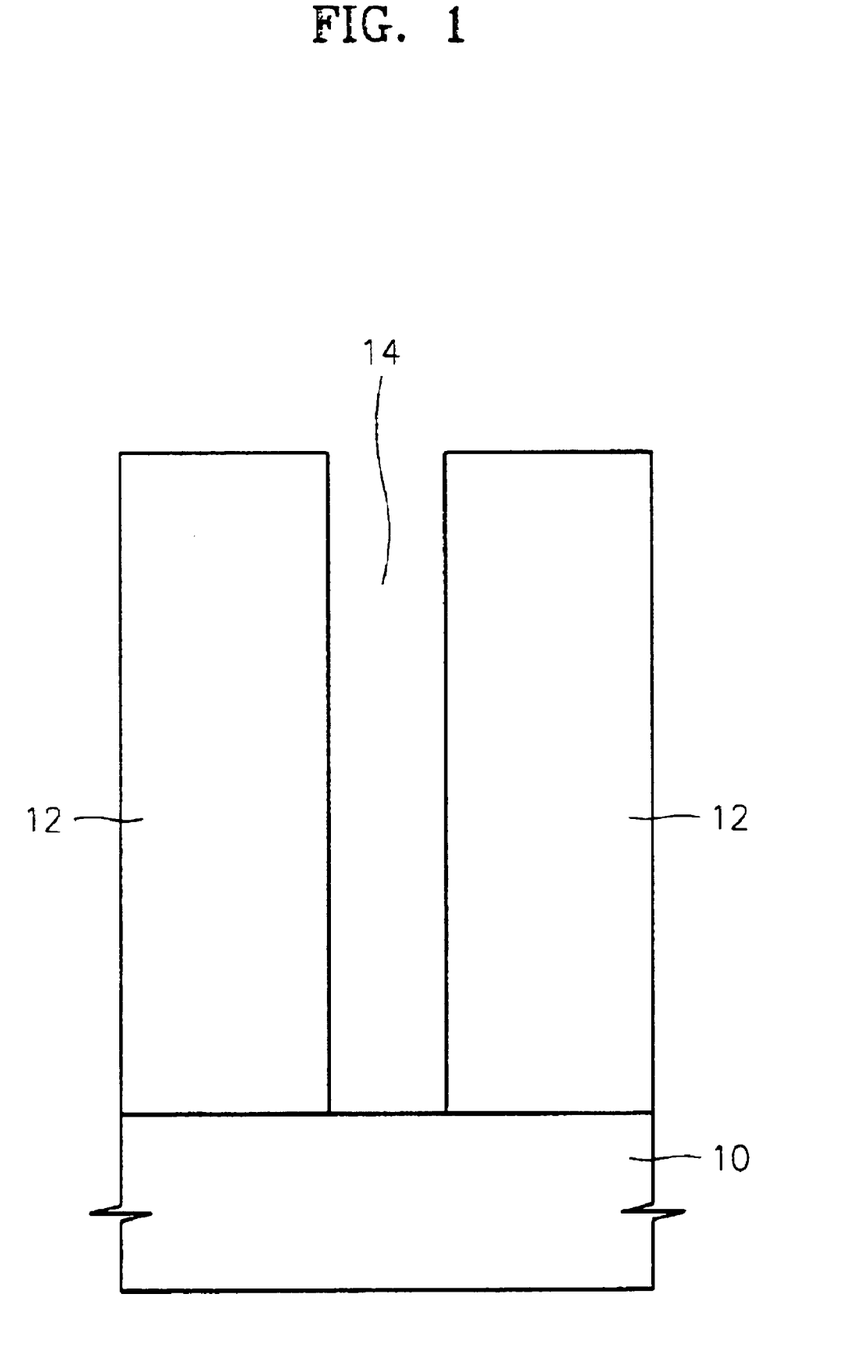
FIGS. 1 through 6 are schematic cross-sectional views illustrating methods of forming a metal wiring layer on an integrated circuit according to some embodiments of the present invention.

The present invention will now be further described with reference to the embodiments illustrated in the figures. FIGS. 1 through 6 are cross-sectional views illustrating methods of forming a metal wiring layer of an integrated circuit according to some embodiments of the present invention. As shown in FIG. 1, an insulating film pattern 12 is formed on an integrated circuit (semiconductor) substrate 10. The insulating film pattern 12 includes a recess region 14. The insulating film pattern 12 may be, for example, an interlayer insulating film formed to separate unit devices or layers of a multi-layered wiring structure of an integrated circuit device. The recess region 14 may be, for example, a contact hole exposing a conductive region on the integrated circuit substrate 10. However, it is to be understood that the recess region 14 need not extend through the insulating film pattern 12 as shown in FIG. 1 and may be a trench formed to a depth that is shallower than the insulating film pattern 12.

Figure 2:
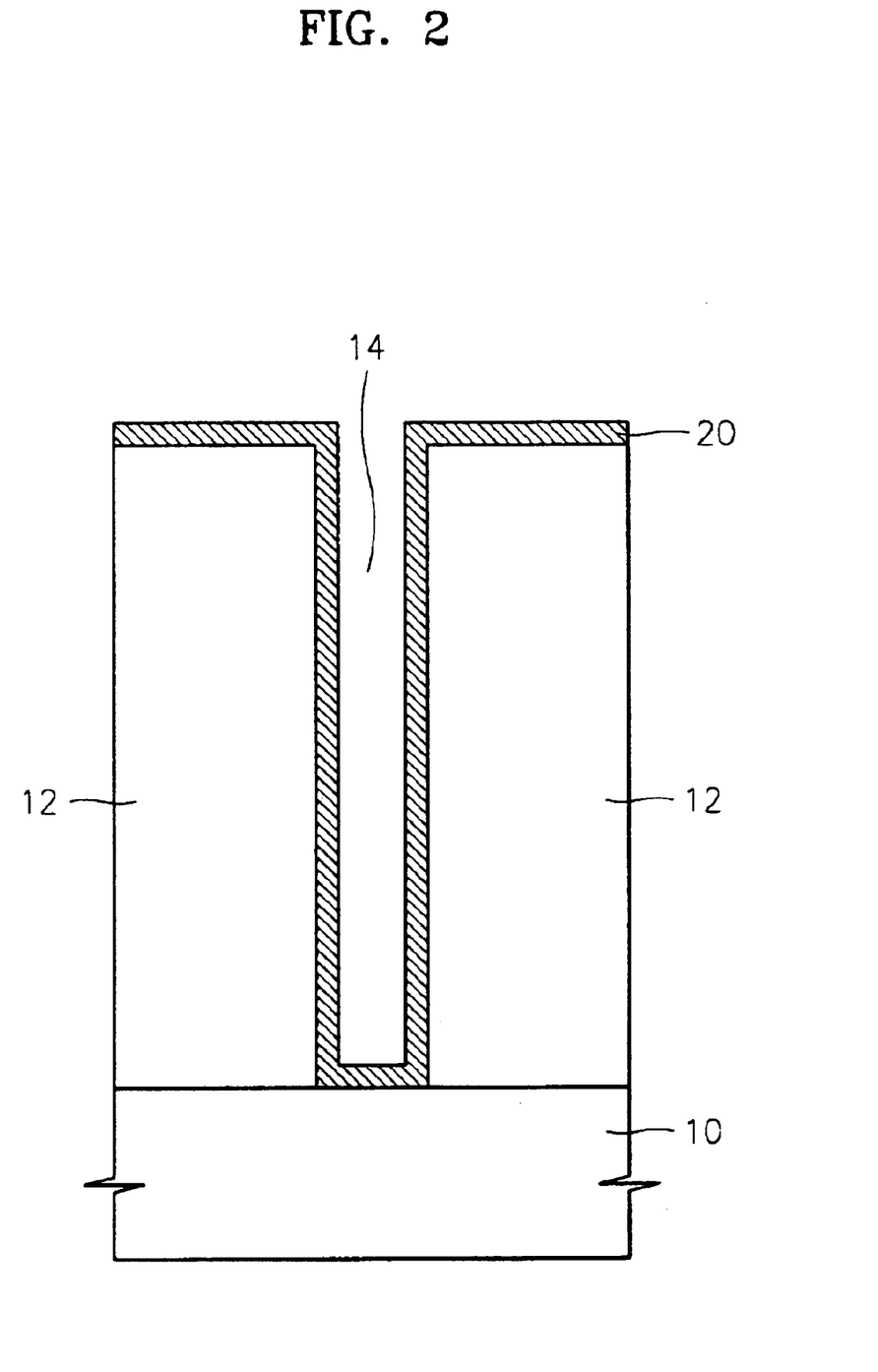

As shown in to FIG. 2, a barrier metal film 20 is formed on the inner walls of the recess region 14 and on a top surface of the insulating film pattern 12. The barrier metal film 20 may be formed, for example, of titanium nitride (TiN). Alternatively, the barrier metal film 20 may be a stack structure, for example, of Ti\TiN.

Figure 3:
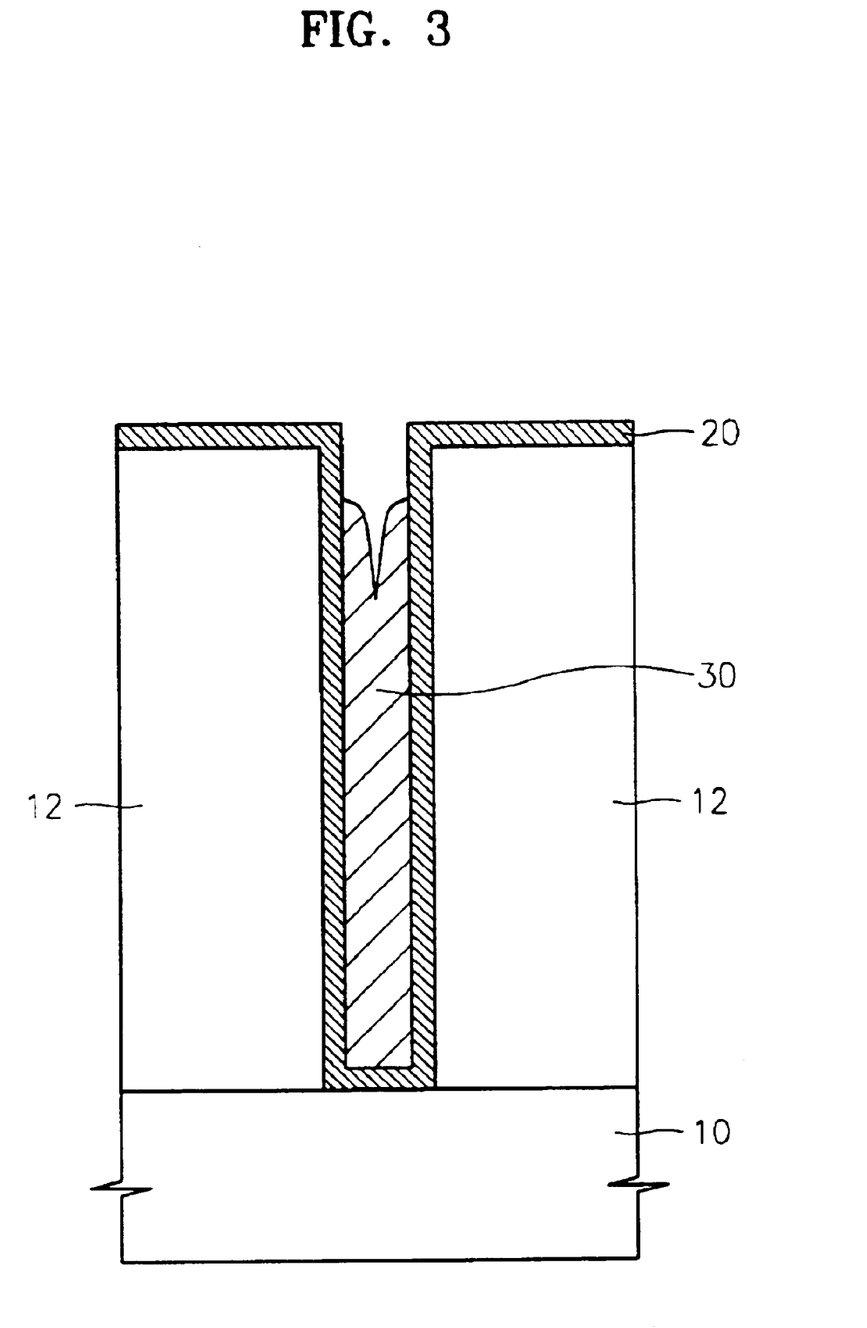

Referring now to FIG. 3, a metal layer or metal plug 30 has been formed on the barrier metal film 20 in the recess region 14. The metal plug 30 may be formed, for example, of tungsten. A tungsten metal plug 30 may be provided by first forming a tungsten film inside the recess region 14 and on an upper surface of the insulating film pattern 12 by, for example, blanket deposition. The tungsten film deposition may be by chemical vapor deposition (CVD) and/or atomic layer deposition (ALD) in various embodiments of the present invention. The tungsten film may formed at a relatively low temperature of about 200° C. to about 400° C. After deposition, the tungsten film is removed from the top surface of the insulating pattern adjacent the recess region 14 and, as a result of the removal process, is also removed from an upper portion of the recess region 14 as illustrated in FIG. 3. The removal process may include planarizing the tungsten film, for example, by using chemical mechanical polishing (CMP) or etching (etchback), to form the metal plug 30 in the recess region 14. However, the removal of the tungsten film from the upper portion of the recess region 14 results in what may be referred to as a key hole in the recess region 14. The generation of the key hole is particularly a problem as the aspect ratio of the recess region 14 increases as a result in decreases in a feature size of the integrated circuit device, for example, as a result of application of a submicron design rule. In particular, as the tungsten film is planarized by chemical mechanical polishing or etchback, the key hole inside the recess region 14 is exposed and formed as a result of over-etching and the upper region or entrance of the recess region 14 is not fully filled up with the tungsten metal plug 30.

Figure 4:
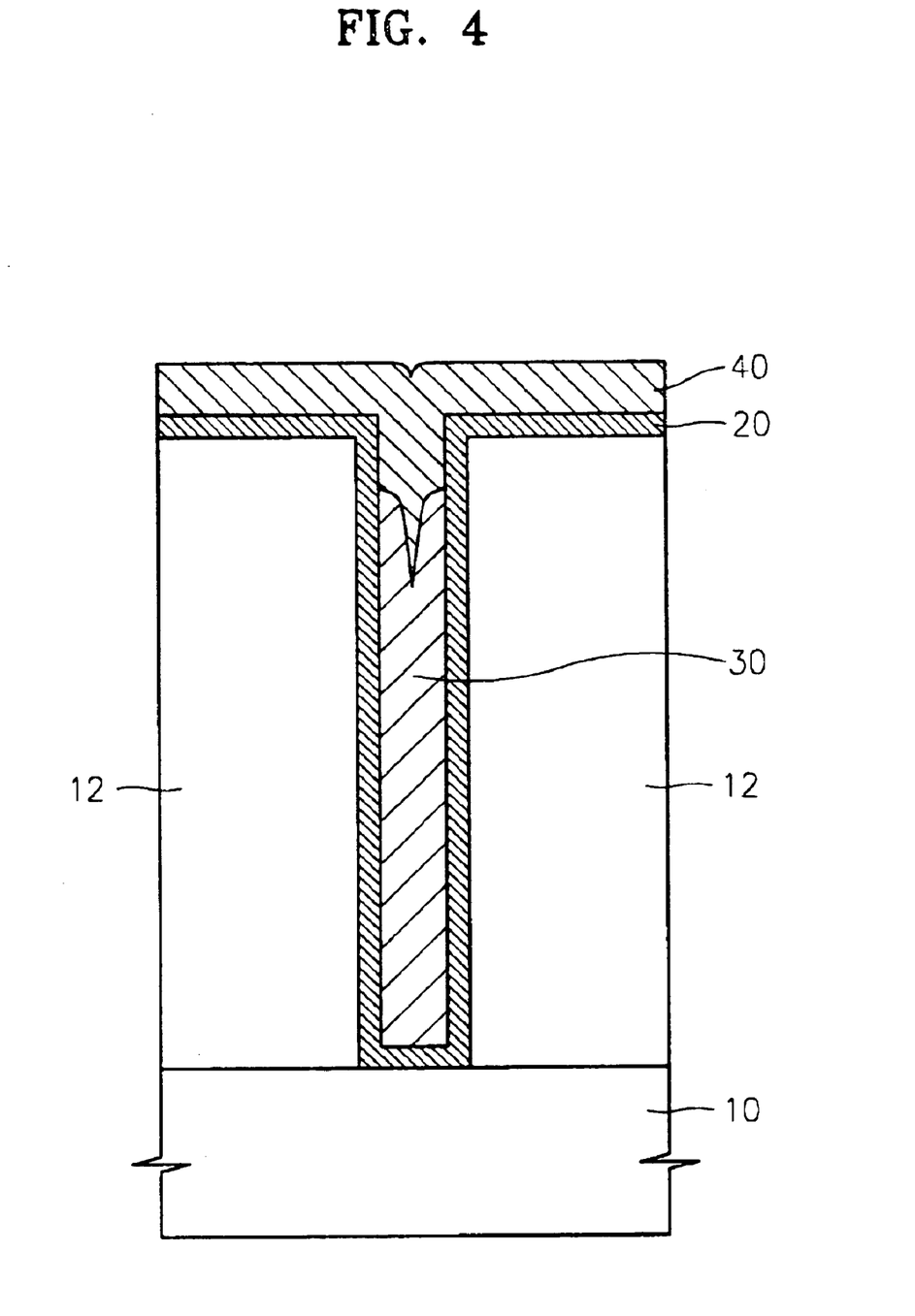

As shown in FIG. 4, an aluminum (Al) film 40 is formed on the metal plug 30 and the insulating film pattern 12 by, for example, chemical mechanical deposition (CMD). The thickness of the Al film 40 in some embodiments of the present invention is about 400 Å to about 1000 Å. The Al film 40 is formed at a process temperature less than a reflow temperature of the metal plug 30 to substantially fill the upper portion of the recess region 14. For example, the Al film 40 may be formed at a relatively low temperature of about 90° C. to about 400° C. In some embodiments of the present invention, the Al film 40 is formed by metal organic chemical vapor deposition (CVD) using a precursor made of an organometallic compound as an Al source. The organometallic compound of the precursor may be, for example, dimethylethylamino alane (DMEAA), methylpyrrolidine alane (MPA), dimethyl aluminum hydride (DMAH), trimethyl aluminum (TMA), trimethylamine alane (TMAA) and/or triisobutyl aluminum (TIBA). For example, when a precursor such as MPA is used as the Al source, the Al film 40 can be formed at a temperature of about 150° C. When a precursor such as DMEAA is used as the Al source, the Al film 40 can be formed at a temperature of about 90° C. to about 120° C.

Thus, the upper portion or entrance of the recess region 14, which is not fully filled with the metal plug 30, can be filled with the Al film 40 by forming the Al film 40 on the metal plug 30 using, for example, chemical vapor deposition (CVD).

Figure 5:
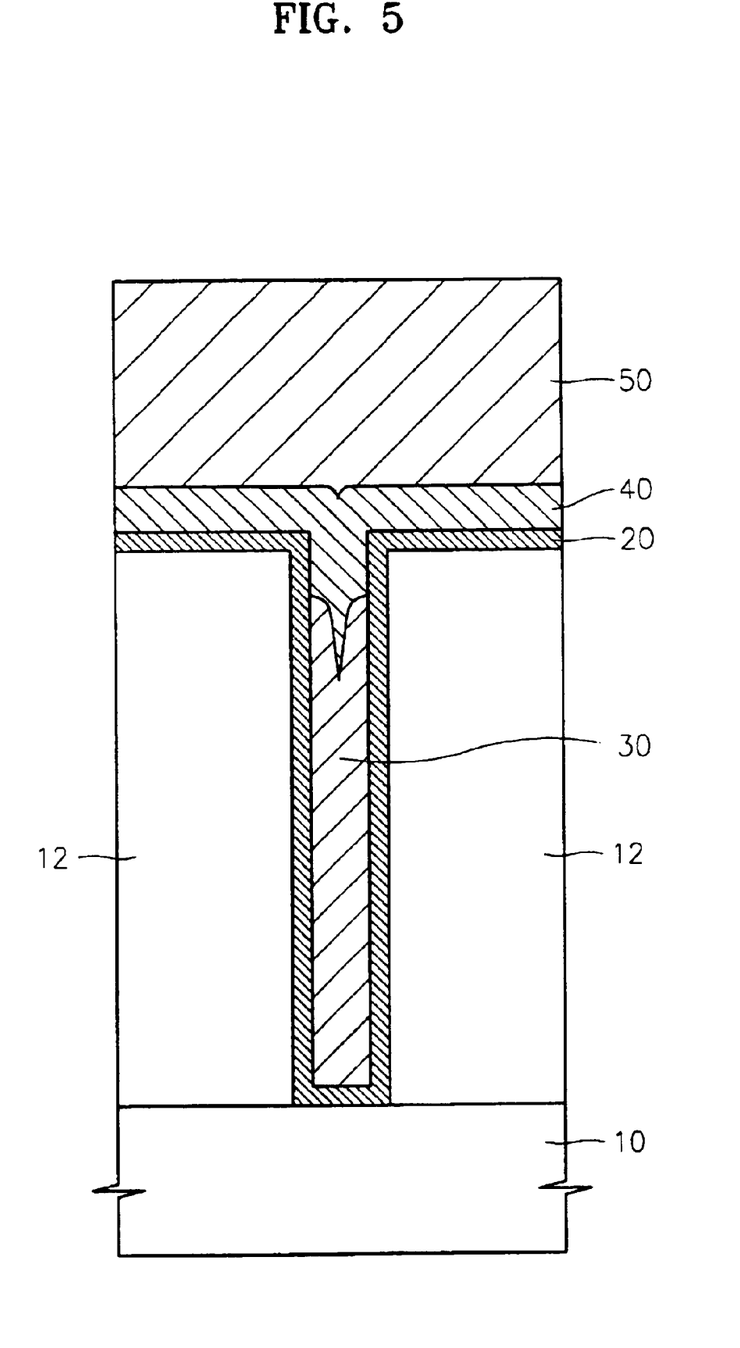

As shown in FIG. 5, a metal film 50 is formed on the Al film 40 using, for example, physical vapor deposition (PVD). The metal film 50 may be an aluminum film or an aluminum alloy film. The metal film 50 is formed at a process temperature less than the reflow temperature of the metal plug 30. For example, the metal film 50 can be formed at a relatively low temperature of about −20° C. to about 400° C. The metal film 50 can be formed using conventional equipment, such as PVD equipment without a heater or using conventional equipment, such as PVD equipment without supplying power to the heater. Therefore, the metal film 50 can be formed at a temperature less than a reflow temperature of the metal plug 30. Furthermore, the metal film 50 can be formed using PVD equipment including a chiller. If the PVD equipment including a chiller is used, the metal film 50 in some embodiments of the present invention can be formed at a temperature of about −20° C.

Figure 6:
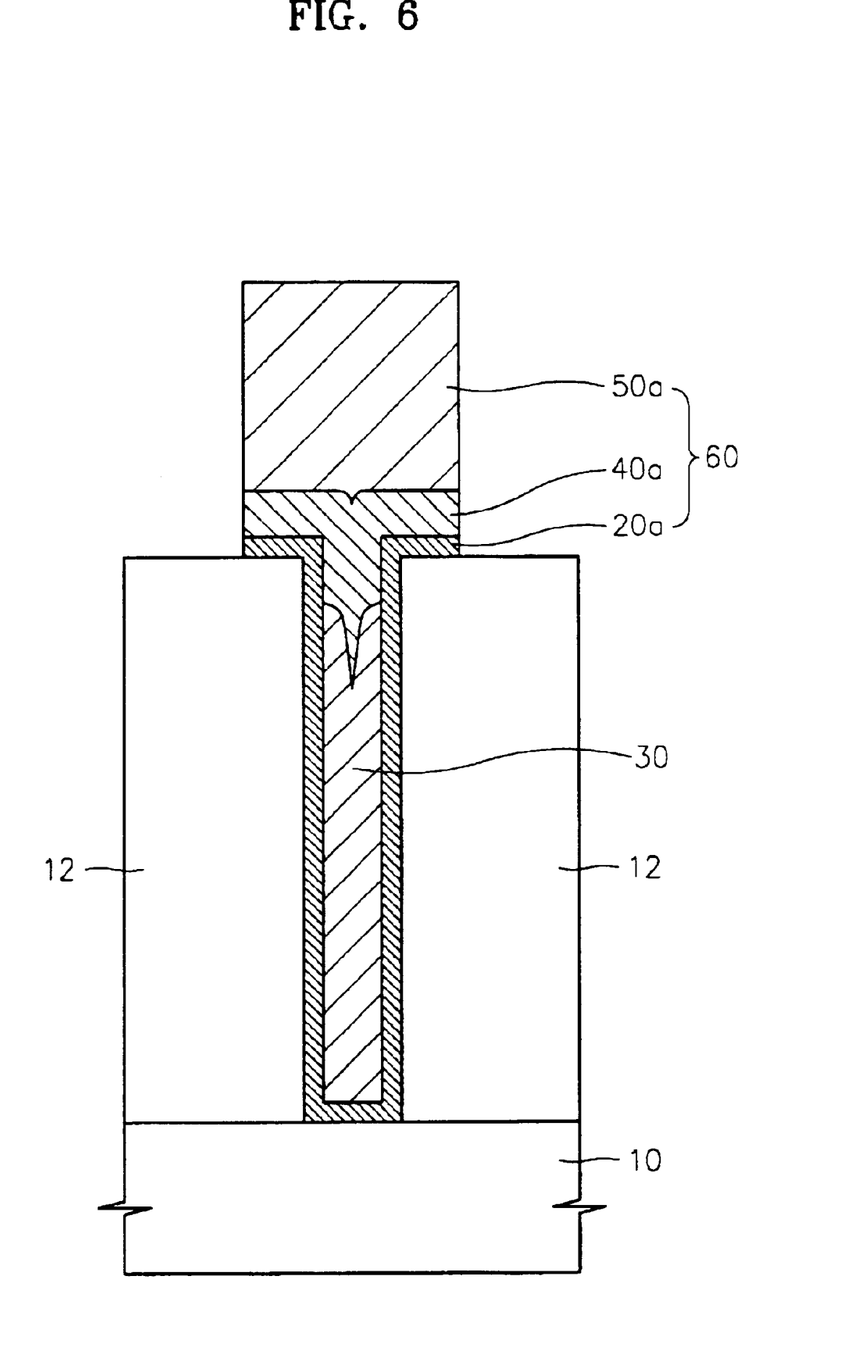

Referring now to FIG. 6, the metal film 50, the Al film 40 and the barrier metal film 20 on the insulating film pattern 12 are sequentially patterned to form a metal wiring layer 60 including a barrier metal film pattern 20a, an Al film pattern 40a and a metal film pattern 50a.

In accordance with some embodiments of the present invention, a metal wiring layer is formed at a relatively low temperature below about 400° C. This method may minimize a thermal budget in an integrated circuit (semiconductor) device manufacturing process. To obtain suitable contact hole filling at temperatures below reflow temperatures, some embodiments of the present invention include a barrier metal film is formed inside of a recess region, such as a contact hole, and on an insulating film pattern. A metal layer is deposited and planarized to form a metal plug in the recess region. To fill an upper region of the recess region that is not filled by the metal plug, an Al film is formed on the metal plug using, for example, chemical vapor deposition (CVD) at a temperature of about 90° C. to about 400° C. Subsequently, a metal film is formed on the Al film using, for example, physical vapor deposition at a temperature of about −20° C. to about 400° C.

According to some embodiments of the present invention, superior fill characteristics may be obtained using a process at a low temperature to fill a high aspect ration recess region without using a process having a high thermal budget, such as a reflow process. As a result, a metal wiring layer of a highly-integrated device may be formed.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a metal wiring layer on an integrated circuit comprising:

forming an insulating pattern including a recess region on an integrated circuit substrate;

forming a metal layer in the recess region and on a top surface of the insulating pattern;

removing the metal layer from the top surface of the insulating pattern adjacent the recess region and from an upper portion of the recess region;

forming an aluminum film on the metal layer at a process temperature less than a reflow temperature of the metal layer to substantially fill the upper portion of the recess region after removing the metal layer; and forming a metal film on the aluminum film at a process temperature less than 300° C.

2. The method of claim 1 wherein removing the metal layer comprises etching or chemical mechanical polishing (CMP) the metal layer.

3. The method of claim 2 wherein forming the metal layer in the recess region is preceded by forming a barrier metal film on inner walls of the recess and on the top surface of the insulating pattern adjacent the recess region.

4. The method of claim 3 wherein forming the barrier film comprises forming a titanium nitride (TiN) and/or a Ti/TiN stack structure barrier film.

5. The method of claim 2 wherein forming the aluminum film comprises forming the aluminum film at a temperature of between about 90° C. and about 400° C.

6. The method of claim 5 wherein forming the aluminum film comprises forming an aluminum film by chemical vapor deposition (CVD).

7. The method of claim 5 wherein forming the aluminum film comprises forming the aluminum film by metal organic chemical vapor deposition using an aluminum source and wherein the aluminum source comprises an organometallic compound selected from the group consisting of dimethylethylamino alane, methylpyrrolidine alane, dimethyl aluminum hydride, trimethyl aluminum, trimethylamine alane and triisobutyl aluminum.

8. The method of claim 2 wherein forming the metal film on the aluminum film comprises forming the metal film at a temperature of between about −20° C. and about 300° C.

9. The method of claim 8 wherein forming the metal film comprises forming the metal film by physical vapor deposition (PVD).

10. The method of claim 8 wherein forming the metal film comprises forming an aluminum film and/or an aluminum alloy film.

11. The method of claim 2 wherein forming the metal layer comprises forming a tungsten layer.

12. The method of claim 11 wherein forming the tungsten layer comprises forming the tungsten layer at a temperature of between about 200° C. and about 400° C.

13. The method of claim 12 wherein forming the tungsten layer comprises forming the tungsten layer by chemical vapor deposition (CVD) and/or atomic layer deposition (ALD).

14. The method of claim 2 wherein forming the insulating pattern is preceded by forming a conductive region on the integrated circuit substrate and wherein the recess region comprises the contact hole extending to the conductive region and forming the metal layer includes forming a metal plug in the contact hole.

15. The method of claim 2 wherein the recess region comprises a trench.

16. The method of claim 2 wherein forming the aluminum film comprises forming the aluminum film to a thickness of from about 400 Å to about 1000 Å.

17. The method of claim 2 wherein back end processing steps following forming the metal layer are performed at process temperatures less than the reflow temperature of the metal layer.

18. A method of forming a metal wiring layer of a semiconductor device, the method comprising:

forming an insulating film pattern including a recess region on a semiconductor substrate;

forming a barrier metal film on inner walls of the recess region and on a top surface of the insulating film pattern;

forming a metal plug on the barrier metal film to fill up the recess region;

forming an aluminum film on the metal plug and the insulating film pattern at a temperature of about 90° C. to about 400° C.; and forming a metal film on the aluminum film at a temperature of about −20° C. to about 300° C.

19. The method of claim 18 wherein forming the aluminum film comprises forming the aluminum film by chemical vapor deposition and wherein forming the metal film comprises forming the metal film by physical vapor deposition.

20. The method of claim 19 wherein the recess region is a contact hole which exposes a conductive region of the semiconductor substrate.

21. The method of claim 19 wherein the recess region is a trench which is formed to a depth that is shallower than a thickness of the insulating film pattern.

22. The method of claim 19 wherein the barrier metal film is formed of titanium nitride (TiN).

23. The method of claim 19 wherein the barrier metal film is a stack structure of Ti/TiN.

24. The method of claim 19 wherein the metal plug is formed of tungsten.

25. The method of claim 24 wherein forming the metal plug further comprises:

forming a tungsten film inside the recess region and on the insulating film pattern; and planarizing the tungsten film to form the metal plug with tungsten inside the recess region.

26. The method of claim 25 wherein the tungsten film is formed by using chemical vapor deposition and/or atomic layer deposition.

27. The method of claim 25 wherein the tungsten film is formed at a temperature of about 200° C. to about 400° C.

28. The method of claim 25 wherein the tungsten film is planarized by using chemical mechanical polishing and/or etchback.

29. The method of claim 19 wherein the aluminum film is formed by using metal organic chemical vapor deposition where an organometallic compound, which is selected from the group consisting of dimethylethylamino alane, methylpyrrolidine alane, dimethyl aluminum hydride, trimethyl aluminum, trimethylamine alane or triisobutyl aluminum, is used as an aluminum source.

30. The method of claim 19 wherein the metal film is formed of an aluminum film or an aluminum alloy film.

31. The method of claim 1 wherein forming the aluminum film comprises forming the aluminum film at a temperature of between about 90° C. and about 120° C.

32. The method of claim 1 wherein forming the aluminum film comprises forming the aluminum film at a temperature of about 150° C.

33. The method of claim 9 wherein forming the metal film by PVD comprises forming the metal film using PVD equipment without using the heater.

34. The method of claim 9 wherein forming the metal film by PVD comprises forming the metal film at the temperature of about −20° C.

35. The method of claim 18 wherein forming the aluminum film comprises forming the aluminum film at a temperature of between about 90° C. and about 120° C.

36. The method of claim 18 wherein forming the aluminum film comprises forming the aluminum film at a temperature of about 150° C.

37. The method of claim 19 wherein forming the metal film by physical vapor deposition comprises forming a metal film using physical vapor deposition equipment without using a heater.

38. The method of claim 19 wherein forming the metal film by physical vapor deposition comprises forming metal film at the temperature of about −20° C.

39. The method of claim 18 wherein forming the aluminum film comprises forming the aluminum film to a thickness of from about 400 Å to about 1000 Å.

* * * * *

UNITED STATES PATENT AND TRADEMARK OFFICE
CERTIFICATE OF CORRECTION

PATENT NO.     : 6,951,814 B2
DATED          : October 4, 2005
INVENTOR(S)    : Byung-hee Kim et al.

It is certified that error appears in the above-identified patent and that said Letters Patent is hereby corrected as shown below:

Column 8,
Line 19, should read -- equipment without using a heater. --.
Lines 31 and 35, should read -- film by physical vapor deposition comprises forming the metal --.

Signed and Sealed this

Thirty-first Day of January, 2006

JON W. DUDAS
*Director of the United States Patent and Trademark Office*